United States Patent [19]
Marutsuka

[11] Patent Number: 6,143,674
[45] Date of Patent: *Nov. 7, 2000

[54] ELECTROMAGNETIC RADIATION SHIELD MATERIAL AND PANEL AND METHODS OF PRODUCING THE SAME

[75] Inventor: Toshinori Marutsuka, Tokyo, Japan

[73] Assignee: Nisshinbo Industries, Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/154,163

[22] Filed: Sep. 16, 1998

[30] Foreign Application Priority Data

Sep. 29, 1997 [JP] Japan .................................. 9-279422

[51] Int. Cl.⁷ .................................................. B32B 15/01
[52] U.S. Cl. ................................... 442/8; 442/6; 442/16; 442/44; 428/329; 428/372
[58] Field of Search ..................... 428/329, 372, 428/401, 402; 442/414, 417, 6, 16, 8, 44

[56] References Cited

U.S. PATENT DOCUMENTS

| | | | |
|---|---|---|---|
| 4,435,465 | 3/1984 | Ebneth et al. | 428/195 |
| 4,631,214 | 12/1986 | Hasegawa | 428/68 |
| 4,845,402 | 7/1989 | Smith | 313/422 |
| 5,352,565 | 10/1994 | Schroeder | 430/320 |
| 5,670,742 | 9/1997 | Jones | 174/35 |

FOREIGN PATENT DOCUMENTS

| | | |
|---|---|---|
| 0 840 542 | 5/1998 | European Pat. Off. . |
| WO97/32458 | 9/1997 | WIPO . |

OTHER PUBLICATIONS

*Patent Abstracts of Japan*, 017(286) (M–1422), abstract of JP 5–016281 (Jun. 1993).
*Patent Abstracts of Japan*, 098(003), abstract of JP 9–298384 (Feb. 1998).

*Primary Examiner*—Blaine Copenheaver
*Assistant Examiner*—Ula C. Ruddock
*Attorney, Agent, or Firm*—Wenderoth, Lind & Ponack, L.L.P.

[57] ABSTRACT

An electromagnetic radiation shield material and an electromagnetic radiation shield panel suitable for placement in front of a display device to enable a viewer to see images displayed on the display device through the plate or panel while shielding the viewer from electromagnetic radiation and methods of producing the material and the panel are provided. The electromagnetic radiation shield material comprises at least a mesh-like metallic foil layer, a black resin portion of identical mesh-like pattern to the metallic foil layer and in aligned contact therewith, and a transparent base material. The electromagnetic radiation shield panel comprises a laminated composite of the electromagnetic radiation shield material and a display panel or a transparent base plate and is constituted so that the metallic foil layer is on the side facing the display device and the black resin portion is located outward of the metallic foil layer.

17 Claims, 1 Drawing Sheet

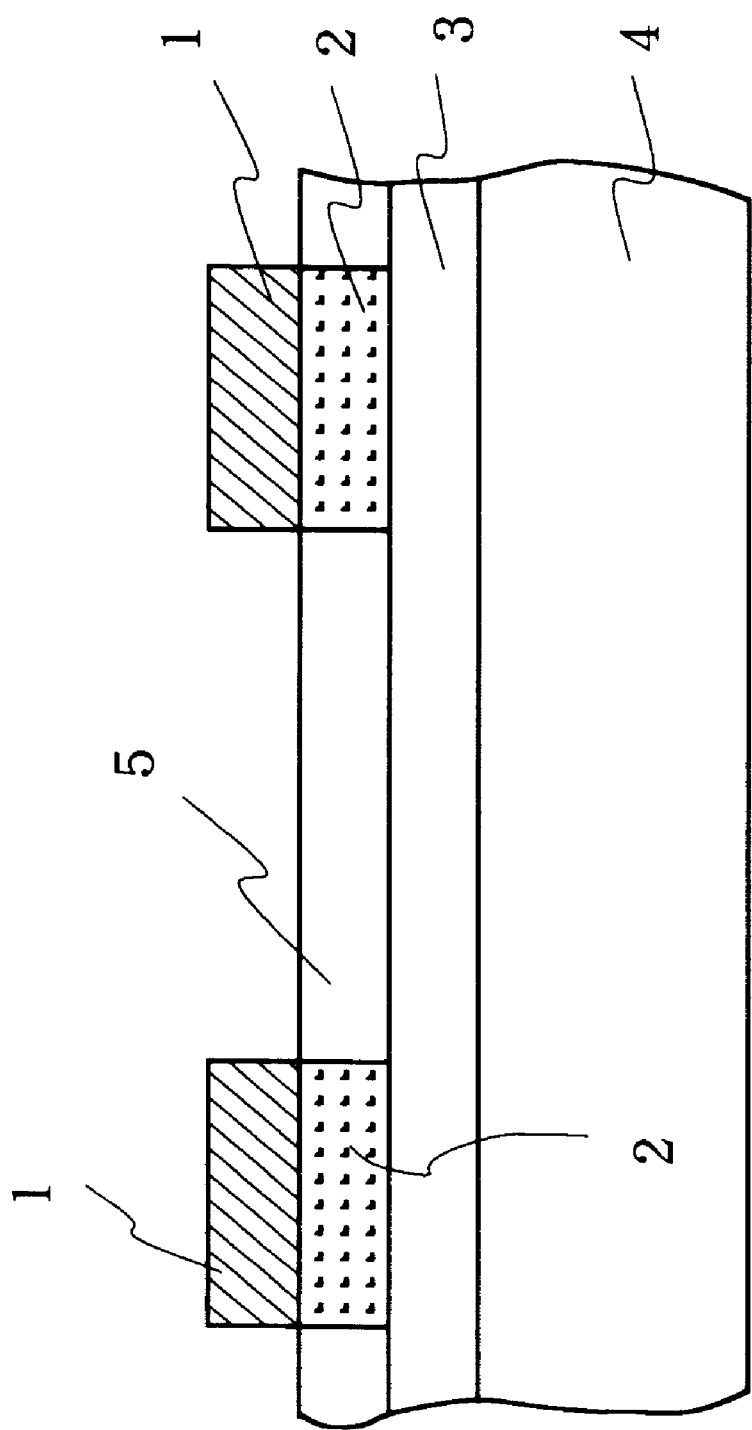

ELECTROMAGNETIC RADIATION SHIELD MATERIAL AND PANEL AND METHODS OF PRODUCING THE SAME

BACKGROUND OF THE INVENTION

1. Field of the Invention

This invention relates to a transparent electromagnetic radiation shield material and a transparent electromagnetic radiation shield panel for placement in front of a display device or other such source of electromagnetic radiation to shield the viewer from electromagnetic radiation, and to methods of producing the material and panel. It particularly relates to a panel suitable for a large plasma display.

2. Description of the Background Art

An electromagnetic radiation shield material for placement in front of a display device or other source of electromagnetic radiation is required to have not only excellent electromagnetic radiation shielding capability but also excellent transparency (optical transmittance), good clarity (degree of coating blackness etc.), wide viewing angle and the like. Japanese Patent Application Laid-Open No. 9-298384 teaches an electromagnetic radiation shield material meeting these requirements to some extent. Specifically, this laid-open patent application teaches a method wherein "a step of providing a black dyed layer on a transparent base material, a step of providing a metallic layer on the black dyed layer, a step of providing a patterned resist layer on the metallic layer and a step of removing portions of the metallic layer not covered by the resist layer by etching with an etching solution are conducted in succession, portions of the black dyed layer not covered by the patterned metallic layer being decolored in the etching step."

Generally, however, a sufficient degree of coating blackness and good clarity are hard to obtain when a black dye is used in a black resin layer. The dye content and/or the resin layer thickness therefore has to be increased.

Moreover, when the etching solution for the metallic layer is used to decolor and extract the black dye, the metallic layer comes to be over-etched owing to the long time needed for the decoloration.

SUMMARY OF THE INVENTION

For overcoming the aforesaid drawbacks of the prior art, this invention provides:

An electromagnetic radiation shield material comprising at least a mesh-like metallic foil layer, a black resin portion of identical mesh-like pattern to the metallic foil layer and in aligned contact therewith, and a transparent base material;

An electromagnetic radiation shield panel comprising a laminated composite of an electromagnetic radiation shield material and a display panel or a transparent base material, a metallic foil of the electromagnetic radiation shield material being disposed on the side intended to face a source of electromagnetic radiation and a black resin portion being disposed outward of the metallic foil;

A method of producing an electromagnetic radiation shield material comprising a step of providing in order on a transparent base material a black resin layer including a black pigment, a metallic foil layer, and a mesh-like resist layer, a step of etching metallic foil portions not protected by the resist layer to impart the metallic foil with a mesh-like pattern like the resist, and a step of extracting and removing black pigment from a portion of the black resin layer not in contact with the mesh-like metallic foil layer to form a black resin portion, and;

A method of producing an electromagnetic radiation shield material comprising a step of providing in order on a transparent base material an adhesive layer, a black resin layer including a black pigment, a metallic foil layer, and a mesh-like resist layer, a step of etching metallic foil portions not protected by the resist layer to impart the metallic foil with a mesh-like pattern like the resist, and a step of extracting and removing black pigment from a portion of the black resin layer not in contact with the mesh-like metallic foil layer to form a black resin portion.

When the transparent base material is a continuous web (roll) of film, sheets of different sizes can be cut from the obtained transparent electromagnetic radiation shield film while avoiding inclusion of defective portions, whereafter the cut sheets can be easily laminated to display panels or transparent base plates. By this, the invention can achieve high yield and low cost. Since the roll film can be produced by a continuous process, its productivity is higher than when the transparent base material is plate-like. Owing to its flexibility, moreover, the film can also be used to produce curved shields.

In accordance with another aspect of the invention, a transparent electromagnetic radiation shield panel is produced by laminating a transparent electromagnetic radiation shield film to a display panel or a transparent base plate by an intervening adhesive layer on the surface of the electromagnetic radiation shield layer.

BRIEF EXPLANATION OF THE DRAWING

FIG. 1 is partial sectional view of one example of an electromagnetic radiation shield material according to the invention.

DETAILED DESCRIPTION OF THE PREFERRED EMBODIMENTS

The base material used in this invention is required to be transparent. It is selected according to intended use from among various materials including, for example, glass plate, plastic film, plastic sheet and plastic plate. The shape of the base material is not particularly limited.

A plastic used as the base material is preferably a resin with high transparency. Preferable examples include acrylic resins, polycarbonate, polyethylene, AS resins, vinyl acetate resin, polystyrene, polypropylene, polyester, polysulfone, polyethersulfone, polyvinylchloride, olefine-maleimide copolymer, and norbornene resins. Among these, olefine-maleimide copolymer and norbornene resins are particularly preferable owing to their high heat resistance.

The plastic should preferably have a thermal-deformation temperature of 140–360° C., a coefficient of thermal linear expansion of not greater than $6.2 \times 10^{-5}$ cm/cm.° C., a pencil hardness of not less than 2H, a bending strength of 1,200–2,000 kgf/cm$^2$, a modulus of elasticity in bending of 30,000–50,000 kgf/cm$^2$, and a tensile strength of 700–1,200 kgf/cm$^2$. A plastic with these properties is resistant to high-temperature warping and scratching, and can therefore be used in a wide range of environments.

The plastic preferably has an optical transmittance of not less than 90%, an Abbe's number of 50–70 and a photoelasticity constant (glass region) of an absolute value of not greater than $10 \times 10^{-13}$ cm$^2$/dyne. A plastic with these properties exhibits high transparency (is bright) and little birefringence (is not likely to produce a double image), and therefore does not degrade the image quality, brightness etc. of the display.

The metallic foil used in this invention is not particularly limited regarding type or thickness insofar it has electromagnetic radiation shielding capability and can be etched. Preferable examples include copper, nickel, iron, stainless steel, titanium, aluminum and gold. Among these, copper foil is particularly preferable from the points of shielding property (resistivity) and etchability. A thicker metallic foil is generally better in shielding performance and a thinner one better in etchability. In the case of a copper foil, since the shielding performance does not change substantially at thicknesses above 5 $\mu$m, one of a thickness of 5–35 $\mu$m, preferably 9–18 $\mu$m, is ordinarily used in consideration of handling ease and cost per unit area (18 $\mu$m copper foil currently being cheapest).

The pattern and aperture ratio of the metallic foil are not particularly limited insofar as they are within ranges ensuring sufficient electromagnetic radiation shielding performance and optical transmittance. Even a parallel line pattern, for example, provides shielding effect (exhibiting directionality in the near field). Since the effect is insufficient, however, a mesh pattern is ordinarily used. Various basic mesh patterns are available, including grid (tetragonal), triangular, polygonal, circular and elliptical.

The aperture ratio (the ratio of the non-metallic foil portion area relative to the repeated pattern unit area) is determined by the line width and interval (opening width) of the metallic foil pattern. Different patterns with the same aperture ratio have the same optical transmittance. Since the electromagnetic radiation shielding performance increases with decreasing opening width, however, a narrower opening width is ordinarily preferable. Nonetheless, the opening width is finally decided to fall within the range that does not cause occurrence of Moiré fringes when the electromagnetic radiation shielding is disposed on the front of the display panel.

The resin in the resin solution containing the black pigment (the black coating liquid) applied to the metallic foil is not particularly limited by type insofar as it is transparent and is capable of efficiently dispersing or dissolving the black pigment.

Since the black pigment in the black coating is extracted and removed chiefly in aqueous solution, the resin used is preferably a hydrophilic transparent resin. Preferable hydrophilic transparent resins include vinyl acetal resins, vinyl alcohol resins, acrylic resins, cellulose resins and the like. Among these, vinyl acetal resins such as polyvinyl butyral and cellulose resins such as cellulose acetate butylate are particularly preferred.

The black pigment used in this invention consists of reduced metal particles or metal oxide particles. The reduced metal particles are colloid particles contained in a reduced metal colloid dispersion or reduced metal powder particles obtained from the metal colloid dispersion. They are not particularly limited as regards type of metal or grain size insofar as they are uniformly dispersable in the coating liquid (coating) and do not impair the coating transparency after extraction and removal. For easy extraction, however, the grain size of the reducing metal particles is preferably not greater than 1 $\mu$m. They preferably have high stability with respect to the atmosphere and moisture.

Specific examples of usable reduced metal particles include particles of metals belonging to Group Ib or Group VIII of the Periodic Table of the Elements (Cu, Ni, Co, Rh, Pd etc.), with reduced Pd colloid particles and reduced Pd powder obtained therefrom being particularly preferable. The reduced metal colloid particles can be produced by the methods described in Japanese Patent Application Laid-Open No. 1-315334. Specifically, a colloid dispersion can be obtained by reducing a salt of the metal in a mixed solution consisting of a lower alcohol and an aprotic polar compound.

The metal oxide particles are not particularly limited as regards type of metal or grain size insofar as they are uniformly dispersable in the coating liquid (coating) and do not impair the coating transparency after extraction and removal. For easy extraction, however, their grain size is preferably not greater than 1 $\mu$m. The metal oxide particles should best remain stably dispersed in the coating liquid (coating). Preferable examples include particles of oxides of metals belonging to Group Ib or Group VIII of the Periodic Table of the Elements such as iron, copper, nickel, cobalt and palladium.

The amount of these black pigments included is preferably in the range of 1–100 PHR (parts by weight based on 100 parts by weight of resin), more preferably 5–50 PHR. When the amount used is less than 1 PHR, the degree of coating blackness is low. An amount exceeding 100 PHR degrades the coating property.

The solvent for the resin solution in this invention can be of any type insofar it can dissolve or be used to prepare a dispersion of the resin and the black pigment.

Preferable solvents include one or a mixture of two or more of, for example, water, methanol, ethanol, chloroform, methylene chloride, trichloroethylene, tetrachloroethylene, benzene, toluene, xylene, acetone, ethyl acetate, dimethylformamide, dimethylsulfoxide, dimethylacetamide and N-methylpyrrolidone. A solvent appropriate for the combination of resin and black pigment is selected.

The amount of solvent used is selected so as to obtain an appropriate viscosity and fluidity and to make the solution appropriate for application to the base material.

The solution of the resin and black pigment (black coating liquid) is applied to the metallic foil and dried to form a coating containing the black pigment. The application of the solution can be carried out by brush coating, spraying, dipping, roller coating, calender coating, spin coating, bar coating or other conventional method selected in view of the shape of the metallic foil.

The conditions (temperature, time etc.) for coating formation are determined based on the type and concentration of the resin, the coating thickness and the like. The non-volatile content of the solution is normally 0.05–20 wt %. The thickness of the dried coating is 0.5–50 $\mu$m, preferably 1–25 $\mu$m. No blackness is observed and the clarity is poor at a thickness of less than 0.5 $\mu$m. Extraction of the unnecessary portion is difficult at a thickness exceeding 50 $\mu$m.

A laminated article is formed by adhering the coated side of the metallic foil formed with the black coating to a transparent base material either directly or via an intervening transparent adhesive. Usable transparent adhesives include polyvinylacetate, acrylic, polyester, epoxy and cellulose type adhesives. The thickness of the adhesive layer is generally not less than 1 $\mu$m, preferably about 5–500 $\mu$m.

As viewed from the side of the transparent base material (thickness: 2 mm, refractive index: 1.49, optical transmittance: 93%, average roughness Ra: 40 Å) of the laminated article, the coating preferably has a degree of blackness, expressed as optical density, of not less than 2.9 (angle of incidence of 7°; assuming no specular component). When the optical density is less than 2.9, clarity of the final transparent electromagnetic radiation shield material is poor owing to the low blackness of the coating. (The intensity of plating glare increases with decreasing optical density.) When the optical density is 2.9 or greater, the blackness of the coating is adequate and clarity excellent (definition high). Clarity as perceived by the naked eye does not improve substantially above an optical density of 4.0.

Next, a resist portion patterned identically to the desired pattern of the metallic foil layer of the electromagnetic radiation shield material is formed on the metallic foil of the laminated article. The resist portion can be formed by a generally known method such as printing or photolithography. The resist portion can be either transparent or colored.

Unnecessary portions of the metallic foil where no resist is present are removed with an etching solution. Removal of black pigment from the coating is preferably effected by soaking in the same etching solution or a separate acidic or alkaline treatment liquid at a temperature of around 10–30° C. for around 1–10 min. Removal can be effected by solution spraying rather than soaking. The removal can be promoted by application of ultrasonic waves.

As a result, the coating is formed under the patterned metallic foil layer with a black portion of the same pattern. The portions where the metallic foil layer and the black pigment in the coating have been removed is transparent. The resist portions are then removed by soaking in or spraying with an exfoliating solution such as an aqueous alkali solution or other such solution capable of dissolving the resist.

Methods that can be used to remove the black pigment include not only the aforesaid extracting but also laser working, sand blasting and the like.

The foregoing processes enable the fabrication of a transparent electromagnetic radiation shield material having a metallic foil layer formed in a desired pattern.

The transparent electromagnetic radiation shield material preferably has an optical transmittance of not less than 65% and a shielding performance of not less than 40 dB in the range of 30 to 1000 MHz. An optical transmittance of less than 65% is too dark and a shielding performance of less than 40 dB is not sufficient for practical applications.

The etching solution is selected as appropriate for the type of metal of the metallic foil layer. In the case of copper foil, for example, ferric chloride or the like can be used as the etching solution.

When the foregoing production method is applied to a transparent film to fabricate a transparent electromagnetic radiation shield film, the transparent electromagnetic radiation shield film is thereafter laminated to a display panel or a transparent base plate, using an intervening transparent adhesive if necessary, to fabricate a transparent electromagnetic radiation shield panel. The transparent film is preferably one constituted as a continuous web that can be continuously processed into a roll. Such films include plastic films having a thickness in the approximate range of 5–300 $\mu$m made of polyethylene terephthalate (PET), polyimide (PI), polyethersulfone (PES), polyether-etherketone (PEEK), polycarbonate (PC), polypropylene (PP), polyamide, acrylic resin, cellulose propionate (CP), and cellulose acetate (CA).

An example of a transparent electromagnetic radiation shield material provided by the invention will now be explained with reference to FIG. 1. FIG. 1 is a sectional view showing the laminated structure of the shield material, which comprises a mesh-like metallic foil layer 1 and a transparent base material 4 sandwiching a black resin portion 2 containing black pigment.

The transparent base material 4 and the black resin portion 2 are adhered to each other by an intervening transparent adhesive layer 3.

The transparent base material and the black resin portion can instead be directly adhered without use of an adhesive. This can be achieved, for example, by rolling, spraying or otherwise applying molten or dissolved black resin on the transparent base material and then drying the applied coating.

Transparent resin 5 removed of the black pigment by extraction is present at interstices in the black resin portion.

EXAMPLE 1

A black coating liquid was prepared by uniformly dispersing black pigment [A] (cupric oxide fine powder, product of Nihon Kagaku Sangyo Co., Ltd.) in an alcohol (ethanol) solution of polyvinylbutyral (PVB) (#6000-C, product of Denki Kagaku Kogyo, Co., Ltd.). (Coating solution composition: cupric oxide/PVB/ethanol=50/100/1850.)

The coating liquid was applied to one surface of 12 $\mu$m electrolytic copper foil (CF T9 SV, product of Fukuda Metal Foil and Powder Co., Ltd.) and dried to obtain a black coating (25 $\mu$m). The coated surface was laminated to an acrylic plate (Delaglas K, product of Asahi Chemical Industry Co., Ltd.) using an acrylic adhesive to obtain a laminated article.

The copper foil side of the laminated article was coated with a positive etching photoresist (PMER P-DF40S, product of Tokyo Ohka Kogyo Co., Ltd.), prebaked, exposed, developed and post-baked to form a resist pattern.

The resist-patterned article was soaked in etching solution (aqueous solution of 20% ferric chloride and 1.75% hydrochloric acid) to dissolve and remove the copper foil layer at the non-resist portions, the cupric oxide powder in the portions of the black coating exposed by removal of the copper foil was further extracted and removed in the same etching solution (extraction solution), and the resist was then peeled off to produce an electromagnetic radiation shield material.

The electromagnetic radiation shield material exhibited shielding performance of 40–80 dB (30–1000 MHz) and transparency (optical transmittance) of 65%, as well as excellent clarity (degree of coating blackness), copper foil adherence, and base plate flatness.

EXAMPLE 2.

An electromagnetic radiation shield material was fabricated in the same manner as in Example 1 except that the cupric oxide fine powder used to prepare the black coating liquid was replaced with black pigment (iron oxide fine powder; Tetsuguro P0023, product of Daido Chemical Industry Co., Ltd.) and that a 5% aqueous hydrochloric acid solution was used as the extraction solution for the black pigment in the coating.

The electromagnetic radiation shield material exhibited excellent performance characteristics similar to those of that obtained in Example 1. It was particularly excellent in clarity (degree of coating blackness).

EXAMPLE 3

An N-methyl-2-pyrrolidone (NMP)/ethanol solution of palladium acetate and an ethanol solution of PVB were mixed under stirring (and heating as required) to prepare a reduced palladium colloid base black coating liquid. (Coating solution composition: palladium acetate/PVB/NMP/ethanol=25/100/1250/2625.)

This coating liquid was used to fabricate an electromagnetic radiation shield material under the same conditions as in Example 1 except that the coating thickness was made 10 μm.

The electromagnetic radiation shield material exhibited excellent performance characteristics similar to those of that obtained in Example 1. It was particularly excellent in clarity (transmittance: 70%)

EXAMPLE 4

An N-methyl-2-pyrrolidone (NMP)/ethanol solution of palladium acetate and an ethanol solution of PVB were mixed under stirring (and heating as required) to prepare a reduced palladium colloid base black coating liquid. (Coating solution composition: palladium acetate/PVB/NMP/ethanol=25/100/1250/2625.)

The coating liquid was applied to one surface of 12 μm electrolytic copper foil (CF T9 SV, product of Fukuda Metal Foil and Powder Co., Ltd.) and dried to obtain a black coating (10 μm). The coated surface was laminated to polyethylene terephthalate (PET) film using an acrylic adhesive to obtain a laminated film.

The copper foil surface of the laminated film was coated with a positive etching photoresist (PMER P-DF40S, product of Tokyo Ohka Kogyo Co., Ltd.), prebaked, exposed, developed and post-baked to form a resist pattern. The resist-patterned film was soaked in etching solution (aqueous solution of 20% ferric chloride and 1.75% hydrochloric acid) to dissolve and remove the copper foil layer at the non-resist portions, the reduced palladium colloid particles in the portions of the coating exposed by removal of the copper foil were further extracted and removed in the same etching solution (extraction solution), and the resist was then peeled off to produce an electromagnetic radiation shield material.

A 10 μm transparent acrylic adhesive layer was formed on the film side of the electromagnetic radiation shield film and the electromagnetic radiation shield film was laminated to a glass plate (thickness: 4 mm) by the adhesive layer to fabricate a transparent electromagnetic radiation shield panel.

The electromagnetic radiation shield panel exhibited shielding performance of 40–80 dB (30–1000 MHz) and transparency (optical transmittance) of 70%, as well as excellent clarity (degree of coating blackness), copper foil adherence, and base panel flatness.

EXAMPLE 5

The transparent electromagnetic radiation shield film of Example 4 was applied on its copper foil pattern side with a transparent adhesive layer as in Example 4 and thereafter laminated to a plasma display panel (PDP) by the adhesive layer to fabricate a transparent electromagnetic radiation shield panel. The electromagnetic radiation shield panel exhibited excellent performance characteristics similar to those of that obtained in Example 4.

EXAMPLE 6

A transparent electromagnetic radiation shield film was produced in the manner of Example 4 except that the PET film of Example 4 was replaced with a triacetyl cellulose (TAC) film laminate obtained by laminating a protective film to TAC film via a transparent acrylic adhesive layer.

The protective film was peeled off the electromagnetic radiation shield film and the electromagnetic radiation shield film was laminated to an acrylic resin plate to fabricate a transparent electromagnetic radiation shield panel. The electromagnetic radiation shield panel exhibited excellent performance characteristics similar to those of that obtained in Example 4.

EXAMPLE 7

A transparent electromagnetic radiation shield film was produced in the manner of Example 4 except that the PET film of Example 4 was replaced with a near infrared (NIR) cut film.

The electromagnetic radiation shield film (the copper foil pattern side thereof) was laminated to a glass plate formed with a transparent adhesive layer to fabricate a transparent electromagnetic radiation shield panel. The electromagnetic radiation shield panel exhibited excellent performance characteristics similar to those of that obtained in Example 4.

EXAMPLE 8

Electromagnetic radiation shield panels were fabricated as in Example 4 except that the acrylic plate used as the transparent base material in Example 4 was replaced with transparent heat-resistant plastic plates made of olefine-maleimide copolymer (TI-160, product of Tosoh Corporation) and norbornene resin (Arton, product of Japan Synthetic Rubber Co., Ltd.).

The electromagnetic radiation shield panels exhibited excellent performance characteristics similar to those of that obtained in Example 4. They were superior to the electromagnetic radiation shield panel of Example 4 in base panel flatness (noticeably less warp for a base panel of the same thickness and area).

When an electromagnetic radiation shield panel utilizing a plastic base panel low in heat resistance and rigidity is disposed in front of a (plasma) display, pronounced warping of the base panel owing to heat from the display frequently causes the display to crack or produce Moiré fringes. The electromagnetic radiation shield panels obtained in this Example were totally free of these problems.

EXAMPLE 9

A transparent electromagnetic radiation shield material was produced in the manner of Example 1 except that the copper foil was replaced with 15 μm aluminum foil (product of Toyo Aluminium Foil Products K.K.).

The electromagnetic radiation shield material exhibited excellent performance characteristics similar to those of that obtained in Example 1. Use of aluminum foil enables production of light and inexpensive electromagnetic radiation shield materials.

COMPARATIVE EXAMPLE 1

A coating liquid was prepared in the manner of the black coating liquid of Example 1 except that the cupric oxide fine powder was replaced with black metal-containing acid dye (LC2951 LY BLACK BG EX CC, product of Sumika Dyestuffs Technology Co., Ltd.). However, owing to the occurrence of a precipitate (thought to be Glauber's salt $Na_2SO_4$), the coating liquid was filtered and the filtrate (slightly reddish black) was used as the final coating liquid.

An attempt was made to use the coating liquid to fabricate a transparent electromagnetic radiation shield material in the same manner as in Example 1 except for forming the coating to a thickness of 50 µm. However, difficulty was encountered in effecting discoloration (extraction and removal) with the etching solution. An attempt was therefore made to effect discoloration with the discoloring solution (extraction solution) changed to ethanol. Since a considerable amount of resin dissolved out in conjunction with this discoloration, the treated resin coating exhibited a rough surface and low transparency.

Although the electromagnetic radiation shield material provided about the same shielding performance as that of the Example 1, it was extremely poor in clarity. Specifically, the blackness of the black pattern (degree of coating blackness) was low (the coating thickness was double that in Example 1) and the resolution was poor. Transparency (optical transmittance) was a low 40%.

COMPARATIVE EXAMPLE 2

A coating liquid was prepared in the manner of the black coating liquid of Example 1 except that the cupric oxide fine powder was omitted.

The coating liquid was used to form a coating on the copper foil as in Example 1, but to a thickness of 50 µm.

The copper foil formed with the coating was soaked for 1 hr in the same black dye aqueous solution as that of Comparative Example 1 (a somewhat bluish black solution). The blackness (degree of coating blackness) was deficient to the point that is was obvious that any electromagnetic radiation shield material fabricated would have bad clarity. The processing was therefore discontinued.

TABLE 1

| | Black resin coating (Black pigment/resin) | Metallic foil | Transparent base material | Shielding performance[1] | Transparency[2] (Optical transmittance) | Clarity[3] (Degree of coating blackness) | Remarks |
|---|---|---|---|---|---|---|---|
| Example | | | | | | | |
| 1 | Cupric oxide powder/ PVB (25 µm) | Cu (12 µm) | Acrylic plate | ○ | ○ | ○ | |
| 2 | Iron oxide fine powder/PVB (25 µm) | " | " | ○ | ○ | ◎ | |
| 3 | Reduced Pd colloidal particles/PVB (10 µm) | " | " | ○ | ◎ | ○ | |
| 4 | Reduced Pd colloidal particles/PVB (10 µm) | " | PET film | ○ | ◎ | ○ | Laminated to glass plate to make panel |
| 5 | Reduced Pd colloidal particles/PVB (10 µm) | " | " | ○ | ◎ | ○ | Laminated to PDP to make panel |
| 6 | Reduced Pd colloidal particles/PVB (10 µm) | " | TAC film | ○ | ◎ | ○ | Laminated to acrylic plate to make panel |
| 7 | Reduced Pd colloidal particles/PVB (10 µm) | " | NIR cut film | ○ | ◎ | ○ | Laminated to glass plate to make panel |
| 8 | Reduced Pd colloidal particles/PVB (10 µm) | Cu (12 µm) | PET film | ○ | ◎ | ○ | Laminated to heat-resistant resin base plate[4] to make panel |
| 9 | Cupric oxide powder/ PVB (25 µm) | Al (15 µm) | Acrylic plate | ○ | ○ | ○ | Light/inexpensive |
| Comparative Example | | | | | | | |
| 1 | Metal-containing acid dye/PVB (50 µm) | Cu (12 µm) | Acrylic plate | ○ | x | x | |
| 2 | Metal-containing acid dye/PVB (50 µm) | " | — | — | — | x | Dyed with metal-containing acid dye |

Remarks:
[1]Electric field shielding performance (dB) at 30–1000 MHz measured by electromagnetic radiation shielding performance tester (TR-17301, product of Advantest Corporation).
○: 40–80 dB
[2]Transmittance (%) at wavelength 550 nm measured by spectroanalyzer (UV-240, product of Shimadzu Corp.).
◎: ≧80%
○: <80%–≧65%
x: <50%
[3]Optical density (angle of incidence of 7°; assuming no specular component) measured by spectrophotometric colorimeter (CMS-35SP), product of Murakami Color Research Laboratory, Ltd.
◎: ≧2.9
○: <2.9–≧2.7
x: <2.7
[4]Base plate of olefine-maleimide copolymer or norbornene resin.

The present invention provides the following advantageous effects:

(1) Pattern design is subject to little restriction.
(2) The degree of blackness and the resolution of the black pattern on the transparent base material side are high, providing outstanding clarity. The long-term stability of these properties is excellent.
(3) An earth lead line can be easily connected.

(4) Conductivity is high owing to the use of metallic foil, giving a high shielding effect, and high optical transmittance can be obtained since the aperture ratio can be set high. The long-term stability of these properties is excellent.

(5) Since no plating is necessary, the problem of decreased adhesiveness between the coating and the base material and between the plating and the coating that occurs during plating does not exist.

(6) Material and production costs are markedly lower than by the plating method.

(7) The viewing angle is wide.

(8) Yield is good because the sheets to be laminated to transparent base plates can be cut to different sizes from a web (roll) of the transparent electromagnetic radiation shield film while avoiding inclusion of defective portions.

(9) Curved shields can also be produced.

What is claimed is:

1. An electromagnetic radiation shield material having a shielding performance of not less than 40 dB in the range of 30 to 1000 MHz and an optical transmittance of not less than 65%, comprising at least a mesh copper foil layer, a black resin portion of identical mesh pattern to the copper foil layer and in aligned contact therewith, and a transparent base material.

2. The electromagnetic radiation shield material according to claim 1, wherein the copper foil layer and the transparent base material face each other across the black resin portion.

3. The electromagnetic radiation shield material according to claim 2, wherein the copper foil layer and the transparent base material face each other across the black resin portion and transparent resin portions are present at interstices between the black resin portions.

4. The electromagnetic radiation shield material according to claim 2, wherein the transparent base material and the black resin portion are adhered by an intervening adhesive layer.

5. An electromagnetic radiation shield panel comprising a laminated composite of an electromagnetic radiation shield material according to claim 1 and a display panel or a transparent base plate, the copper foil layer being disposed on the side intended to face a source of electromagnetic radiation and the black resin portion being disposed outward of the copper foil layer.

6. The electromagnetic radiation shield panel according to claim 5, wherein the black resin portion is a resin coating containing dispersed black pigment.

7. The electromagnetic radiation shield panel according to claim 5, wherein the black pigment consists of reduced metal particles or metal oxide particles.

8. The electromagnetic radiation shield panel according to claim 5, wherein the grain size of the reduced metal particles or the metal oxide particles is not greater than 1 $\mu$m.

9. The electromagnetic radiation shield panel according to claim 5, wherein the black resin portion has a thickness of 1–25 $\mu$m.

10. The electromagnetic radiation shield material according to claim 1, wherein the black resin portion is a resin coating containing dispersed black pigment.

11. The electromagnetic radiation shield material according to claim 10, wherein the black pigment consists of reduced metal particles or metal oxide particles.

12. The electromagnetic radiation shield material according to claim 11, wherein the grain size of the reduced metal particles or the metal oxide particles is not greater than 1 $\mu$m.

13. The electromagnetic radiation shield material according to claim 1, wherein the black resin portion has a thickness of 1–25 $\mu$m.

14. A method of producing an electromagnetic radiation shield material comprising a step of providing in order on a transparent base material a black resin layer including a black pigment, a metallic foil layer, and a mesh resist layer, a step of etching metallic foil portions not protected by the resist layer to impart the metallic foil with a mesh pattern like the resist, and a step of extracting and removing black pigment from a portion of the black resin layer not in contact with the mesh metallic foil layer to form a black resin portion.

15. The method of producing an electromagnetic radiation shield material according to claim 14, wherein the black pigment consists of reduced metal particles or metal oxide particles.

16. A method of producing an electromagnetic radiation shield material comprising a step of providing in order on a transparent base material an adhesive layer, a black resin layer including a black pigment, a metallic foil layer, and a mesh resist layer, a step of etching metallic foil portions not protected by the resist layer to impart the metallic foil with a mesh pattern like the resist, and a step of extracting and removing black pigment from a portion of the black resin layer not in contact with the mesh metallic foil layer to form a black resin portion.

17. The method of producing an electromagnetic radiation shield material according to claim 16, wherein the black pigment consists of reduced metal particles or metal oxide particles.

* * * * *